(12) United States Patent
Mehrad et al.

(10) Patent No.: US 7,396,716 B2
(45) Date of Patent: Jul. 8, 2008

(54) METHOD TO OBTAIN FULLY SILICIDED POLY GATE

(75) Inventors: Freidoon Mehrad, Plano, TX (US); Shaofeng Yu, Plano, TX (US); Joe G. Tran, Flower Mound, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/201,924

(22) Filed: Aug. 11, 2005

(65) Prior Publication Data

US 2007/0037342 A1 Feb. 15, 2007

(51) Int. Cl.
 *H01L 21/311* (2006.01)
(52) U.S. Cl. .................. 438/230; 438/303; 438/592; 438/595; 257/E29.161; 257/E21.199
(58) Field of Classification Search .................. 438/230, 438/303, 592, 595, FOR. 193; 257/E29.161, 257/E21.199, 900
See application file for complete search history.

(56) References Cited

U.S. PATENT DOCUMENTS

| | | | | |
|---|---|---|---|---|
| 5,280,190 A | * | 1/1994 | Lu | 257/587 |
| 5,731,239 A | * | 3/1998 | Wong et al. | 438/296 |
| 5,759,886 A | * | 6/1998 | Chung | 438/231 |
| 6,140,216 A | * | 10/2000 | Richart et al. | 438/592 |
| 6,143,613 A | * | 11/2000 | Lin | 438/299 |
| 6,153,485 A | * | 11/2000 | Pey et al. | 438/305 |
| 6,235,627 B1 | * | 5/2001 | Nakajima | 438/638 |
| 6,642,592 B2 | * | 11/2003 | Bae et al. | 257/413 |
| 2002/0025634 A1 | * | 2/2002 | Lee et al. | 438/279 |
| 2002/0076907 A1 | * | 6/2002 | Rodder | 438/586 |
| 2005/0064691 A1 | * | 3/2005 | Kim | 438/592 |

* cited by examiner

*Primary Examiner*—George Fourson
(74) *Attorney, Agent, or Firm*—W. James Brady, III; Frederick J. Telecky, Jr.

(57) ABSTRACT

The present invention provides a method of fabricating a microelectronics device. In one aspect, the method comprises forming a capping layer 610 over gate structures 230 located over a microelectronics substrate 210 wherein the gate structures 230 include sidewall spacers 515 and have a doped region 525 located between them. A protective layer 710 is placed over the capping layer 610 and the doped region 525, and a portion of the protective layer 710 and capping layer 610 that are located over the gate structures are removed to expose a top surface of the gate structures 230. A remaining portion of the protective layer 710 and capping layer 610 remains over the doped region 525. With the top surface of the gate structures 230 exposed, metal is incorporated into the gate structures to form gate electrodes 230.

16 Claims, 8 Drawing Sheets

US 7,396,716 B2

METHOD TO OBTAIN FULLY SILICIDED POLY GATE

TECHNICAL FIELD OF THE INVENTION

The present invention is directed in general to a method for manufacturing a microelectronics device, and more specifically, to a method of achieving a fully silicided poly gate.

BACKGROUND

Metal gate electrodes are currently being investigated to replace polysilicon gate electrodes in today's ever shrinking and changing transistor devices. One of the principle reasons the industry is investigating replacing the polysilicon gate electrodes with metal gate electrodes is to solve problems of poly-depletion effects and boron penetration for future CMOS devices. Traditionally, a polysilicon gate electrode with an overlying silicide was used for the gate electrodes in CMOS devices. However, as device feature sizes continue to shrink, poly depletion and gate sheet resistance become serious issues when using polysilicon gate electrodes.

Accordingly, metal gates have been proposed. However, in order to optimize the threshold voltage ($V_t$) in high-performance devices, the metal gates need tunable work functions. For instance, the metal gates need tunable work functions for NMOS and PMOS devices similar to present polysilicon gate technology, requiring the work functions of metal gates to range from 4.1~4.4 eV for NMOS and 4.8~5.1 eV for PMOS (see, B. Cheng, B. Maiti, S. Samayedam, J. Grant, B. Taylor, P. Tobin, J. Mogab, *IEEE Intl. SOI Conf. Proc.*, pp. 91-92, 2001).

Recently, silicided metal gates have been investigated based on the extension of existing self-aligned silicide (SALICIDE) technology. In this approach, polysilicon is deposited over the gate dielectric. A metal is deposited over the polysilicon and reacted to completely consume the polysilicon resulting in a fully silicided metal gate, rather than a deposited metal gate. The silicided metal gate provides a metal gate with the least perturbation to the conventional process and avoids contamination issues. Furthermore, poly doping has been shown to affect the work function of the silicided metal gates.

Complications can arise, however, during the silicidation process. For example, in some conventional processes, an etch is conducted prior to the silicidation process to form sidewall spacers, which can expose substrate regions between adjacent transistors to the silicidation process. In such instances, the silicidation process can extended deeply into the moat region, which in turn, can cause shorts to occur in the device.

Accordingly, what is needed in the art is a silicidation process that avoids the deficiencies of the conventional processes discussed above.

SUMMARY OF INVENTION

To overcome the deficiencies in the prior art, the present invention, in one embodiment, provides a method of fabricating a microelectronics device. This method comprises forming a capping layer over gate structures located over a microelectronics substrate wherein the gate structures include sidewall spacers and have a doped region located between them. A protective layer is placed over the capping layer and the doped region, and a portion of the protective layer and capping layer located over the gate structures is removed to expose a top surface of the gate structures. A remaining portion of the protective layer and capping layer remains over the doped region. With the top surface of the gate structures exposed, metal is incorporated into the gate structures to form gate electrodes.

In another embodiment, the present invention comprises a method of fabricating an integrated circuit. This method comprises forming transistors that have silicided gate electrodes and that are located over a microelectronics substrate. The method of forming the transistors comprises forming a capping layer over gate structures located over a microelectronics substrate wherein the gate structures include sidewall spacers and have a doped region located therebetween. A protective layer is placed over the capping layer and the doped region, and a portion of the protective layer and capping layer located over the gate structures are removed to expose a top surface of the gate structures. A remaining portion of the protective layer and capping layer are left over the doped region. Metal is incorporated into the gate structures to form silicided gate electrodes. Dielectric layers are formed over the silicided gate electrodes and interconnects are formed in the dielectric layers to electrically connect the transistors to form an operative integrated circuit.

The foregoing has outlined preferred and alternative features of the present invention so that those of ordinary skill in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the scope of the invention.

BRIEF DESCRIPTION OF THE DRAWINGS

The invention is best understood from the following detailed description when read with the accompanying FIGURES. It is emphasized that in accordance with the standard practice in the semiconductor industry, various features may not be drawn to scale. In fact, the dimensions of the various features may be arbitrarily increased or reduced for clarity of discussion. Reference is now made to the following descriptions taken in conjunction with the accompanying drawings, in which.

DETAILED DESCRIPTION

Figure 1:
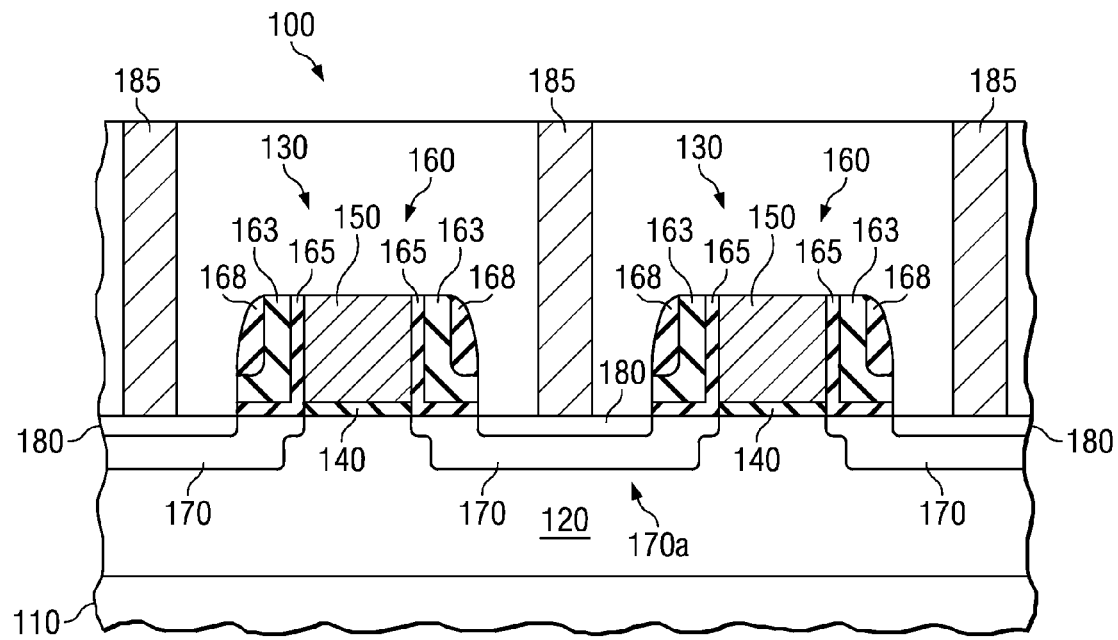
FIG. 1 illustrates a partial sectional view of one embodiment of a microelectronics device, as provided by the present invention.

Turning initially to FIG. 1, there is illustrated a partial sectional view of one embodiment of a microelectronics device 100, as provided by the present invention. The microelectronics device 100 includes a substrate 110. Located within the substrate 110 in the embodiment of FIG. 1 is a well region 120. Located over the substrate 110 and well region 120 are gate structures 130.

The gate structures 130 illustrated in FIG. 1 each include a gate oxide 140 located over the substrate 110, as well as a fully silicided gate electrode 150 located over the gate oxide 140. The silicided gate electrode 150 may have a variety of thicknesses, although a thickness ranging from about 50 nm to about 150 nm is exemplary. The silicided gate electrode 150, when constructed in accordance with the principles of the present invention, may comprise a number of different materials. For instance, in the illustrative embodiment shown in FIG. 1 the silicided gate electrode 150 comprises nickel, however, it is envisioned that the silicided gate electrode 150 could comprise cobalt, platinum, titanium, tantalum, molybdenum, tungsten, etc., while staying within the scope of the present invention.

The silicided gate electrode 150 may also include a dopant or combination of several types of dopants therein. The dopant, such as boron, phosphorous, arsenic or another similar dopant based on whether the semiconductor device 100 is operating as a PMOS device or an NMOS device, is configured to tune the minimum energy required to bring an electron from the Fermi level to the vacuum level, or the so called work function.

The gate structure 130 further contains gate sidewall spacers 160 flanking both sides of the silicided gate electrode 150 and gate oxide 140. The gate sidewall spacers 160 in the embodiment of FIG. 1 may each include one or more different layers. For instance the gate sidewall spacers 160 may also include nitride spacers 163 and sidewall oxides 165 and 168. The gate sidewall spacers 160 may comprise many different types and numbers of layers while staying consistent with the principles of the present invention.

The microelectronics device 100 illustrated in FIG. 1 additionally includes conventional source/drain regions 170 located within the substrate 110 and proximate the gate oxide 140 and within a moat region 170a located between the gate electrodes 150. Located within the source/drain regions 170 are silicided source/drain contact pads 180, on which contact structures 185 are located. The silicided source/drain contact pads 180 in this embodiment comprise nickel silicided source/drain contact pads. Nonetheless, other silicidation materials could be used to form the silicided source/drain contact pads 180 and remain within the scope of the present invention. The silicided source/drain contact pads 180 may have a depth into the source/drain regions 170 ranging from about 10 nm to about 30 nm, among others.

Figure 2:
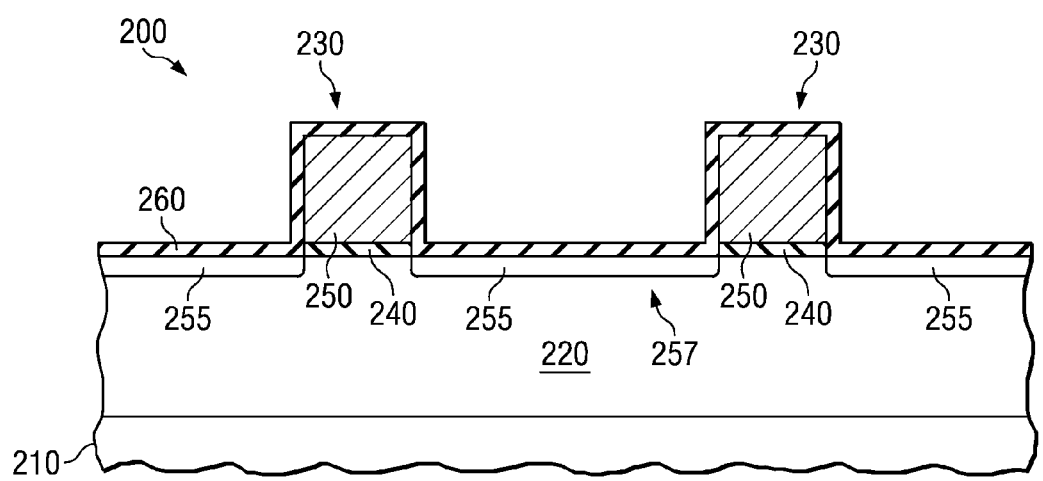
FIG. 2 illustrates a sectional view of a partially completed microelectronics device manufactured in accordance with the principles of the present invention and as discussed with respect to FIG. 1.

Turning now to FIGS. 2-14, illustrated are sectional views of selected manufacturing steps instructing how one might, in an advantageous embodiment, manufacture a microelectronics device similar to the microelectronics device 100 depicted in FIG. 1. FIG. 2 illustrates a partial sectional view of a partially completed microelectronics device 200 manufactured in accordance with the principles of the present invention. The partially completed semiconductor device 200 of FIG. 2 includes a substrate 210. The substrate 210 may, in an exemplary embodiment, be any layer located in the partially completed semiconductor device 200, including a wafer itself or a layer located above the wafer (e.g., epitaxial layer). In the embodiment illustrated in FIG. 2, the substrate 210 is a P-type substrate; however, one skilled in the art understands that the substrate 210 could be an N-type substrate without departing from the scope of the present invention. In such cases, each of the dopant types described throughout the remainder of this document would be reversed. For ease of discussion, no further reference to this opposite scheme will be discussed.

Located within the substrate 210 is a conventionally doped well region 220. The well region 220, in light of the P-type semiconductor substrate 210, would more than likely contain an N-type dopant. For example, the well region 220 would likely be doped with an N-type dopant dose ranging from about 1E13 atoms/cm$^2$ to about 1E14 atoms/cm$^2$ and at a energy ranging from about 100 keV to about 500 keV. This results in the well region 220 having a peak dopant concentration ranging from about 5E17 atoms/cm$^3$ to about 1E19 atoms/cm$^3$. However, it should be noted that the dopant concentrations has stated above may varying, depending on the device's application.

Located over the substrate 210 in the embodiment of FIG. 2 are conventionally formed gate structures 230. In the illustrated embodiment, the gate structures 230 each include a gate oxide 240 and a polysilicon gate electrode 250. The gate oxide 240 may comprise a number of different materials and stay within the scope of the present invention. For example, the gate oxide 240 may comprise silicon dioxide, or in an alternative embodiment comprise a high dielectric constant (K) material. In the embodiment of FIG. 2, however, the gate oxide 240 is a silicon dioxide layer having a thickness ranging from about 0.5 nm to about 5 nm.

Any one of a plurality of well known manufacturing techniques could be used to form the gate oxide 240. For example, the gate oxide 240 may be grown. Additionally, the growth step may require a significant number of different temperatures, pressures, gasses, flow rates, etc., all of which are well known to those who are skilled in the art. In alternative methods, the gate may be deposited by physical or chemical vapor deposition processes, or by atomic layer deposition.

While the advantageous embodiment of FIG. 2 dictates that the polysilicon gate electrode 250 comprise standard polysilicon, other embodiments exist where the polysilicon gate electrode, or at least a portion thereof, comprises amorphous polysilicon. The amorphous polysilicon embodiment may be particularly useful when a substantially planar upper surface of the polysilicon gate electrode 250 is desired.

The deposition conditions for the polysilicon gate electrode 250 may vary, however, if the polysilicon gate electrode 250 were to comprise standard polysilicon, such as the instance in FIG. 2, the polysilicon gate electrode 250 could be deposited using a pressure ranging from about 100 torr to about 300 torr, a temperature ranging from about 620° C. to about 700° C., and a $SiH_4$ or $Si_2H_6$ gas flow ranging from about 50 sccm to about 150 sccm. If, however, amorphous polysilicon were desired, the amorphous polysilicon gate electrode could be deposited using a pressure ranging from about 100 torr to about 300 torr, a temperature ranging from about 450° C. to about 550° C., and a $SiH_4$ or $Si_2H_6$ gas flow ranging from about 100 sccm to about 300 sccm. In any instance, the polysilicon gate electrodes 250 desirably have a thickness ranging from about 50 nm to about 150 nm, and in one embodiment, the thickness is about 80 nm. Conventional blanket deposition and patterning processes may be used to form the gate electrodes 250 and gate oxides 240. Following the patterning of the gate electrodes 250 and gate oxides 240, medium doped drain (MDD) regions 255 are conventionally formed adjacent the gate electrodes 250 and in the moat region 257 between the gate electrodes 250. The MDD regions 255 are conventionally formed and generally have a peak dopant concentration ranging from about 1E19 atoms/$cm^3$ to about 2E20 atoms/$cm^3$. As is standard in the industry, the MDD regions 255 have a dopant type opposite to that of the well region 220 they are located within.

The partially completed semiconductor device 200 illustrated in FIG. 2 further includes a conventionally deposited pad oxide layer 260 located over the gate electrodes 250, resulting in capped gate electrodes 250. Conventional processes, such as chemical vapor deposition, may also be used to form the pad oxide layer 260 over the gate electrodes 250. The pad oxide layer 260, which preferably comprises an oxide, is designed to help protect the source/drains and the moat regions adjacent the gate electrodes 250 during subsequent processing steps, after the silicidation of the gate electrodes 250. In certain exemplary embodiments, it forms a portion of the sidewall spacer, as discussed below. The thickness of the pad oxide layer 260 may vary. For example, its thickness can range from about 10 nm to about 300 nm, but in one advantageous embodiment, the thickness may be about 15 nm.

Figure 3:
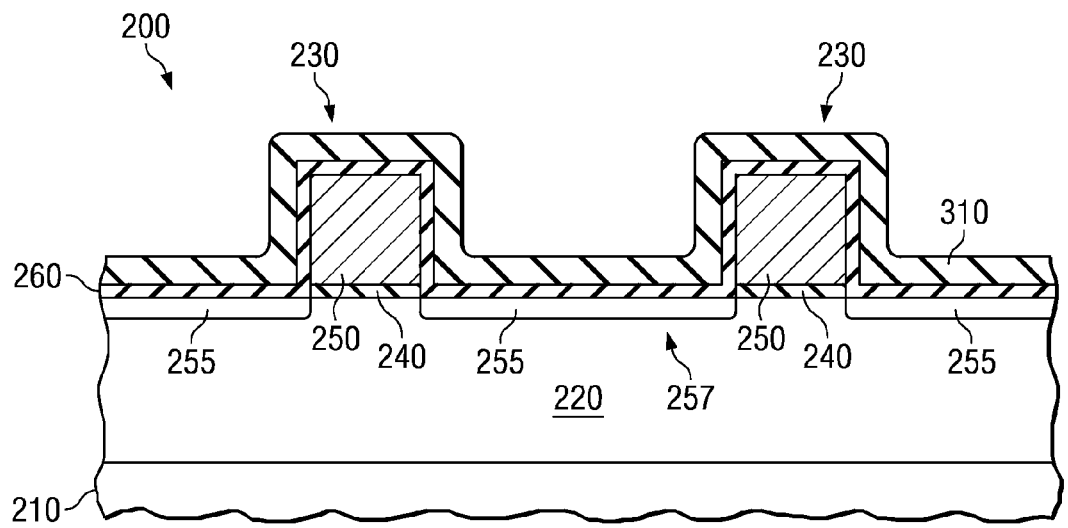
FIG. 3 illustrates a sectional view of the partially completed microelectronics device illustrated in FIG. 2 after the conventional deposition of a nitride layer.

Turning briefly to FIG. 3 illustrated is a sectional view of the partially completed microelectronics device 200 illustrated in FIG. 2 after the conventional deposition of a nitride layer 310. The nitride layer 310 may comprise a standard silicon nitride or a silicon nitride layer having carbon therein. If the nitride layer 310 were to contain the carbon, the carbon might form from about 5% to about 10% of the layer. The thickness of the nitride layer 310 may also vary, depending on design. However, in an advantageous embodiment, the nitride layer 310 has a thickness of about 80 nm and is deposited using a silane and nitrogen gas mixture. The nitride layer 310 is ultimately etched to form a sidewall spacer on each side of the gates, as discussed below.

Figure 4:
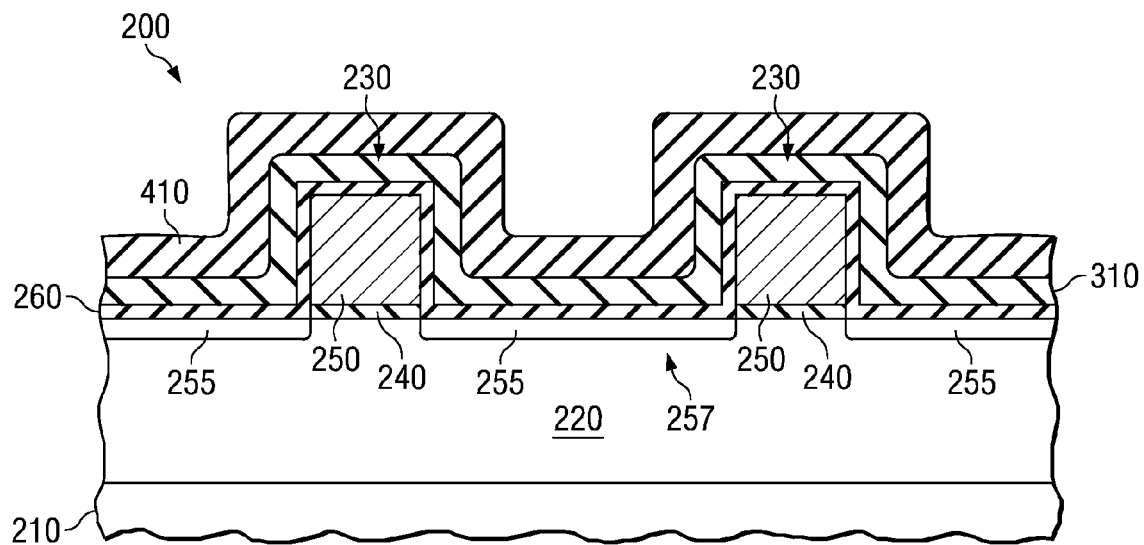
FIG. 4 illustrates a sectional view of the partially completed microelectronics device illustrated in FIG. 3 after the conventional deposition of an oxide layer.

Referring briefly now to FIG. 4, there is shown a sectional view of the partially completed microelectronics device 200 illustrated in FIG. 3 after the conventional deposition of an oxide layer 410. The oxide layer 410 is blanket deposited over the nitride layer 310, and its thickness may range from about 100 nm to about 150 nm. While only three different layers have been illustrated and discussed in the foregoing embodiments, it should be understood that the number of layers may vary, and certain embodiments, may include more than three layers. Moreover, it should be understood that any one or more of the layers may form a spacer material 415 that can be etched to form sidewall spacers for the gate electrodes 250.

Figure 5A:
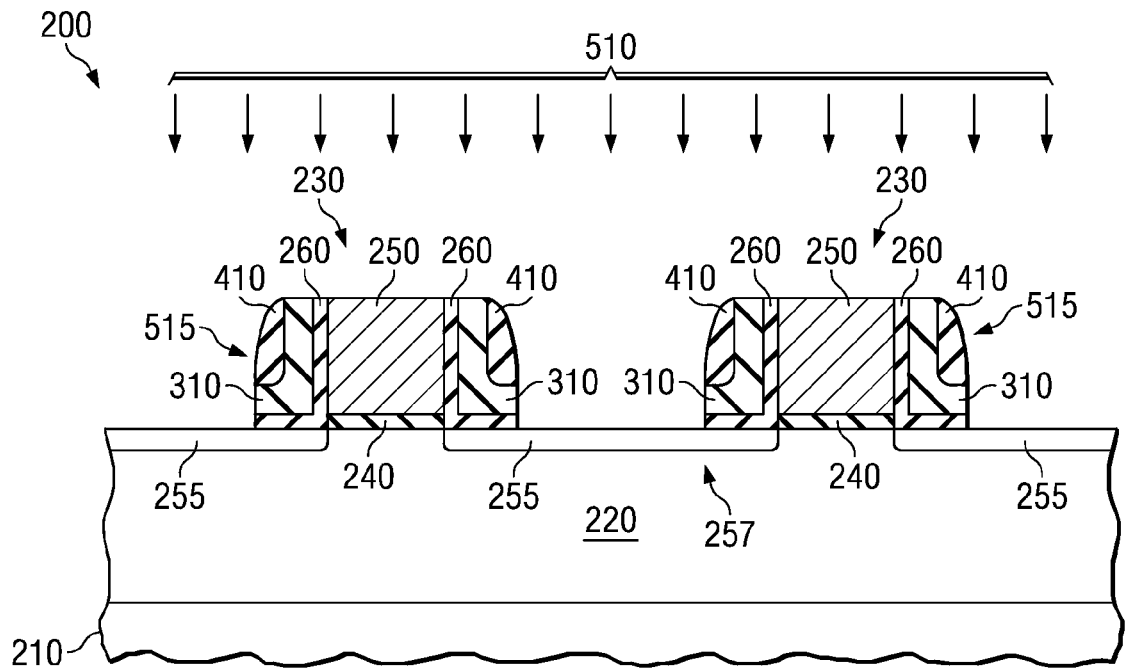
FIG. 5A illustrates a partial sectional view of the partially completed microelectronics device illustrated in FIG. 4 after a conventional sidewall spacer etch.
Figure 5B:
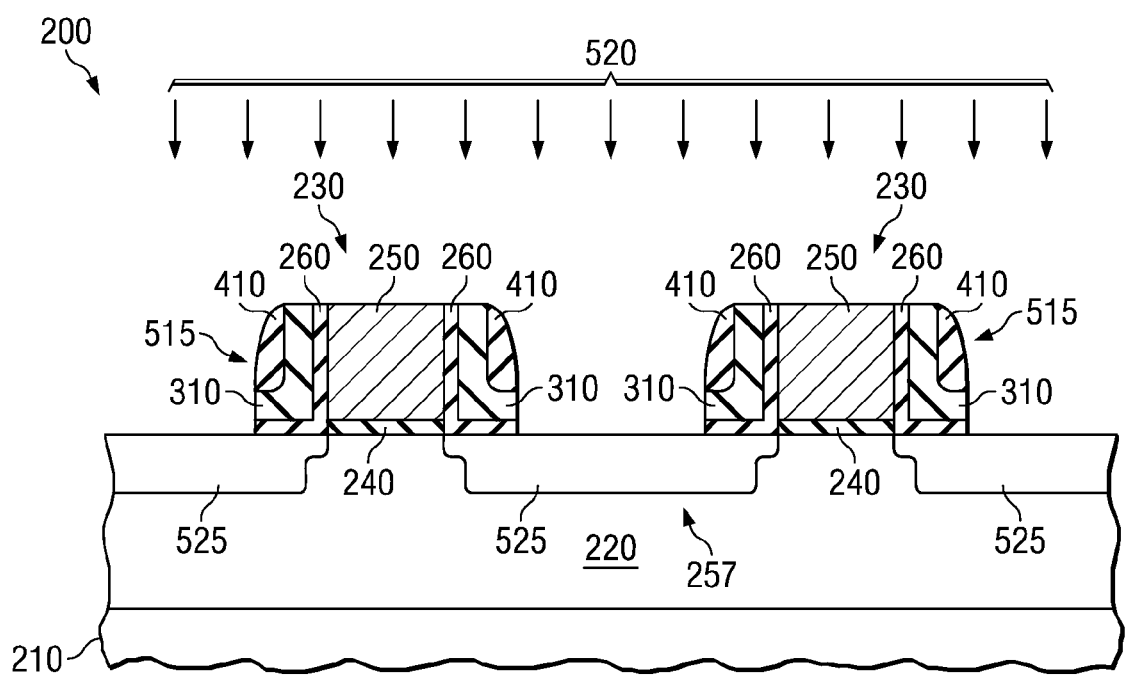
FIG. 5B illustrates a partial sectional view of the partially completed microelectronics device illustrated in FIG. 5B after a conventional source/drain implantation.

Turning now to FIGS. 5A-5B, there are illustrated partial, sectional views of the partially completed microelectronics device 200 illustrated in FIG. 4 following a conventional sidewall etch process 510 as seen in FIG. 5A. The sidewall etch 510 may be conducted with a conventional anisotropic etch to remove lateral portions of the oxide layers 260 and 410 and nitride layer 310 and form the exemplary L-shaped sidewall spacers 515 shown in FIG. 5A. The formation of the sidewall spacers 515 is ultimately followed by a conventional source/drain implant 520 as shown in FIG. 5B, which forms deep source/drains 525 adjacent each of the gate electrodes 250 and within the moat region 257. Generally the source/drain implant 520 involves a high dopant concentration that has a peak dopant concentration ranging from about 1E18 atoms/$cm^3$ to about 1E21 atoms/$cm^3$. Also, the highly doped source/drain implant 520 should typically have a dopant type opposite to that of the well region 220 in which it is implanted. Following the source/drain implant 520, a standard source/drain anneal is conducted to activate and form the source/drain regions 525. It is believed that a source/drain anneal conducted at a temperature ranging from about 1000° C. to about 1100° C. and a time period ranging from about 1 second to about 5 seconds would be sufficient. It should be noted that other temperatures, times, and processes could be used to activate the source/drain regions 525 and such processes are known to those skilled in the art.

Figure 6:
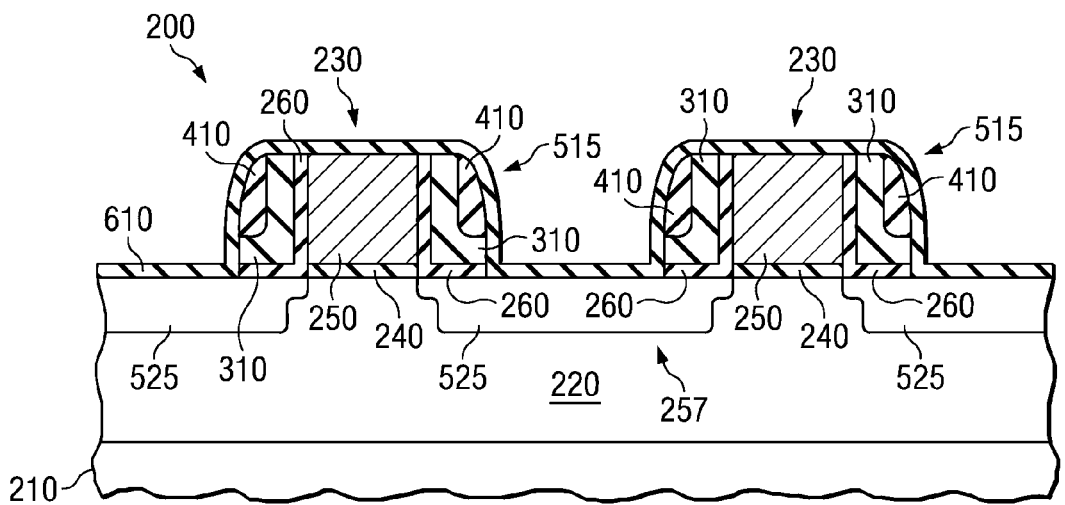
FIG. 6 illustrates a partial sectional view of the partially completed microelectronics device illustrated in FIG. 5B following the deposition of a capping layer over the gate electrode, source/drains and moat region.

Referring now to FIG. 6, there is illustrated a partial, sectional view of the partially completed microelectronics device 200 illustrated in FIG. 5B following the conventional deposition of a capping layer 610. The capping layer 610 is preferably silicon dioxide. Conventional deposition processes, such as chemical vapor deposition or chemical vapor deposition may be used to deposit the cap layer 610. The thickness of the cap layer 610 may range from about 5 nm to about 15 nm, with 5 nm being a preferred thickness. As shown in the exemplary embodiment illustrated in FIG. 6, the capping layer 610 is conformally deposited over both gate structures 230, the source/drains 525 and the moat region 257. As discussed below, the capping layer 610 helps to protect the moat region 257 and source/drains 525 during the silicidation of the gate electrodes 250, and it also serves to protect the gate electrodes 250 from subsequent etch processes that might otherwise remove excessive amounts of the gate electrodes 250.

Figure 7:
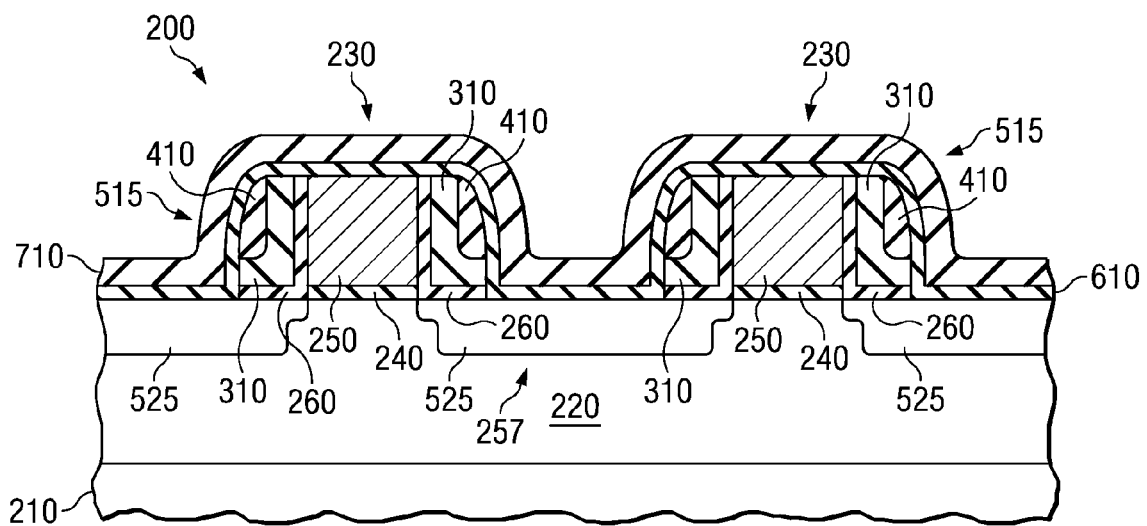
FIG. 7 illustrates a partial sectional view of the partially completed microelectronics device illustrated in FIG. 6 following the blanket deposition of a protective layer over the capping layer.

Turning now to FIG. 7, there is illustrated a partial, sectional view of the microelectronics device 200 of FIG. 6 following the deposition of a protective layer 710 over the capping layer 610. The protective layer 710 may be a single layer that is capable of protecting the source/drains 525 and moat region 257 during a silicidation process, or it may be used in conjunction with other underlying layers, such as the capping layer 610 to protect the those regions during a silicidation process. The protective layer 710, in an exemplary embodiment, comprises nitride or oxide with an exemplary material being silicon nitride or silicon oxynitride. However, other materials that are capable of protecting the moat region 257 and source/drains 525 from the subsequent gate silicidation process are also within the scope of the present invention. Conventional deposition processes, such as chemical vapor deposition, physical vapor deposition or atomic layer deposition may be used to deposit the protective layer 710. The thickness of the protective layer 710 may range from about 20 nm to about 40 nm, with 30 nm being a preferred thickness. As shown in the exemplary embodiment illustrated in FIG. 7, the protective layer 710 is conformally deposited over both gate electrodes 250, the source/drains 525 and the moat region 257. Moreover, as discussed below, the protective layer 710 helps to protect the moat region 257 and source/drains 525 during the silicidation of the gate electrodes 250.

Figure 8:
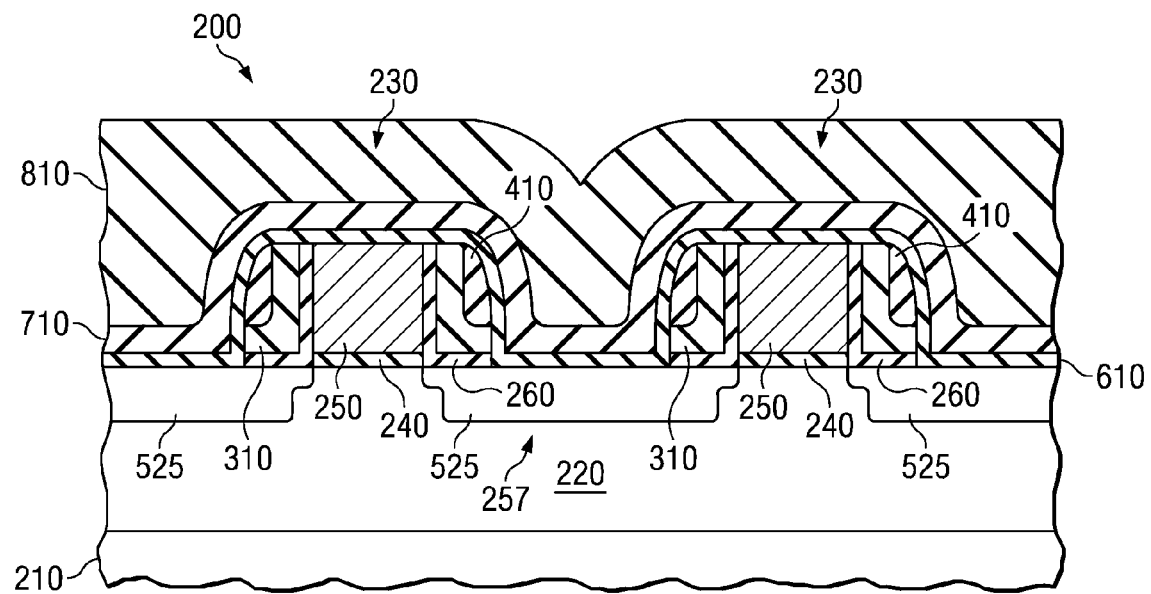
FIG. 8 illustrates a partial sectional view of the partially completed microelectronics device illustrated in FIG. 7 following the deposition of a dielectric layer over the protective layer.

Turning now to FIG. 8, there is illustrated a partial, sectional view of the microelectronics device 200 of FIG. 7 following the deposition of a dielectric layer 810 over the protective layer 710. In an exemplary embodiment, the dielectric layer 810 comprises silicon dioxide. Conventional deposition processes, such as chemical vapor deposition or physical vapor deposition, may be used to deposit the dielectric layer 810. In one embodiment, the dielectric layer 810 is tetra orthosilicate (TEOS), and the thickness of the dielectric layer 810 may vary with a preferred thickness being about 200 nm. As shown in the exemplary embodiment of FIG. 8, the dielectric layer 810 is conformally deposited over the protective layer 710, including both gate electrodes 250, the source/drains 525, and the moat region 257. As discussed below, the dielectric layer 810 inhibits the removal of the protective layer 710 located over the source/drains 525 and the moat region 257 during an etch process that is conducted to remove a portion of the protective layer 710 located over each of the gate electrodes 250.

Figure 9:
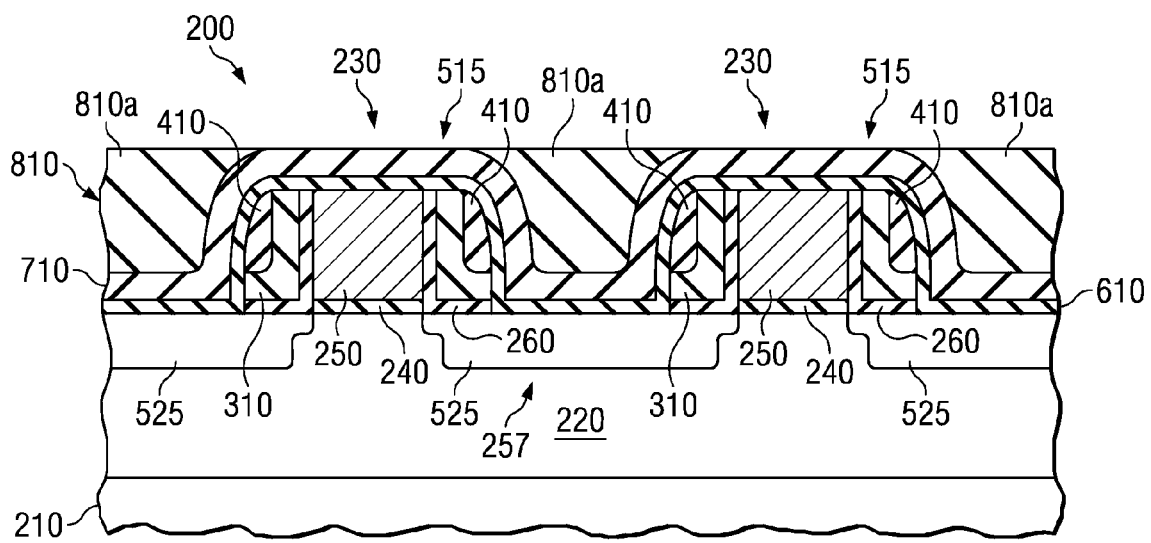
FIG. 9 illustrates a partial sectional view of the partially completed microelectronics device illustrated in FIG. 8 following the removal of a portion of the dielectric layer to expose the protective layer, with a remaining portion of the dielectric layer being located over the source/drains and moat region.

Referring now briefly to FIG. 9, there is illustrated a partial, sectional view of the microelectronics device 200 of FIG. 8 following a partial removal of the dielectric layer 810. The dielectric layer 810 is removed to expose the underlying protective layer 710 that is substantially located over the gate electrodes 250. This partial removal exposes a portion of the protective layer 710 so that it can be removed by a subsequent process. Preferably, portions 810a of the dielectric layer 810 remain over the moat region 257 and the source/drain regions 525. The presence of the remaining portions 810a of the dielectric layer 810 prevent or limit unwanted removal of the protective layer 710 overlying these regions during subsequent processing steps. The dielectric layer 810 may be removed using any conventional process. For example, a chemical/mechanical polishing (CMP) process may be used to remove the dielectric layer 810 down to and substantially stopping on the protective layer 710. While a small portion (less than 2 nm) of the protective layer 710 may be removed during this process, it remains substantially intact.

Figure 10:
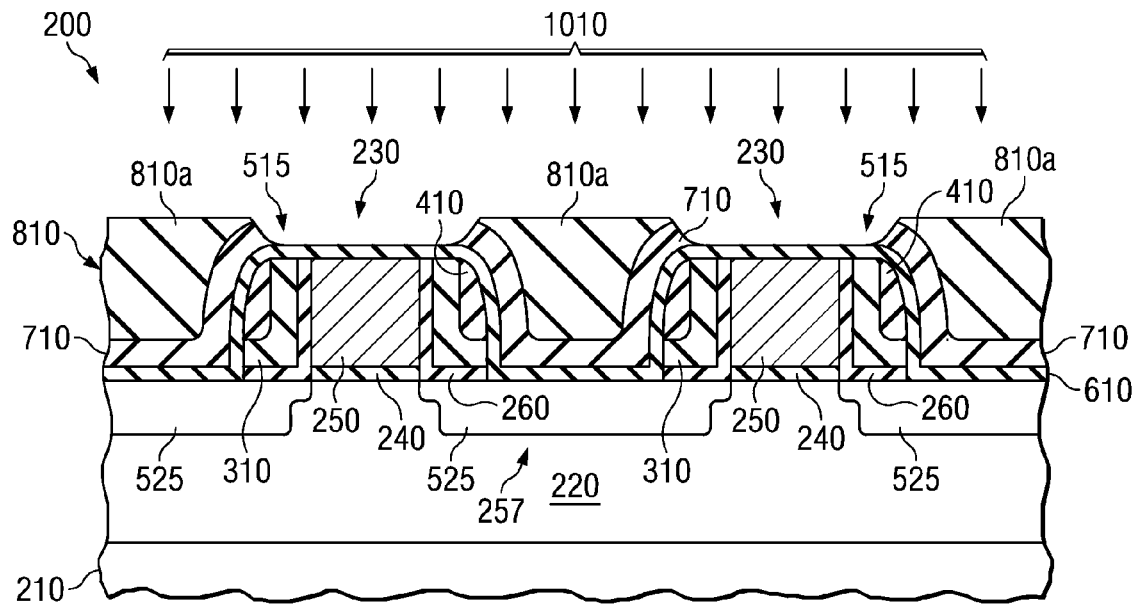
FIG. 10 illustrates a partial sectional view of the partially completed microelectronics device illustrated in FIG. 9 following an etch process that removes a portion of the protective layer located over the gate electrodes to expose the capping layer with a portion remaining over the source/drains and moat region.

Turning now to FIG. 10, there is illustrated a partial, sectional view of the microelectronics device 200 of FIG. 9 following the removal of a portion of the protective layer 710. In an advantageous embodiment, an etch 1010 is conducted to remove a portion of the protective layer 710 that overlies the gate electrodes 250. The etch chemistry will vary depending on the type of material from which the protective layer 710 is comprised. For example, in those embodiments where the protective layer 710 is comprised of a nitride material, the etch may be a dry nitride etch. In one aspect of this particular embodiment, the dry nitride etch comprises a mixture of gases. For example, the gas mixture may be a mixture of difluoromethane flowed at about 85 sccm, oxygen flowed at about 13 sccm, argon flowed at about 47 sccm and methane flowed at about 28 sccm. The etch rate in one exemplary embodiment is about 1200 A/min with selectivity to the gate electrode etch rate of about 24. The chuck temperature may vary depending on the tool with about 65 degrees Celsius being an exemplary temperature. In another embodiment, the etch may be a wet etch, such as a hot phosphoric acid etch. In such embodiments, the hot phosphoric acid etch is conducted at a temperature of about 160 degrees Celsius. It should be understood that the foregoing is exemplary only and that other removal techniques, such reactive ion etching may also be employed to remove the portion of the protective layer 710.

The chosen removal process will be selective to the dielectric layer 810 and the capping layer 610; that is the selected etch or other removal technique should remove the protective layer 710 at a much higher rate than the surrounding materials. Since the etch is selective to the surrounding materials, only small amounts of the dielectric layer 810 and the capping layer 610 will be removed at this point in the process. In the exemplary embodiment illustrated in FIG. 10, the etch removes the protective layer 710 to expose the capping layer 610 that is located over the top portion of the gate electrodes 250. However, the gate electrodes 250 are unaffected by the etch 1010 because a substantial portion of the capping layer 610 remains during the etch to protect the gate electrodes 250 from the effects of the etch process. In some instances, the gate electrodes may be susceptible to the etch 1010. Thus, the capping layer 610 advantageously prevents the etch 1010 from affecting the gate electrodes 250.

Figure 11:
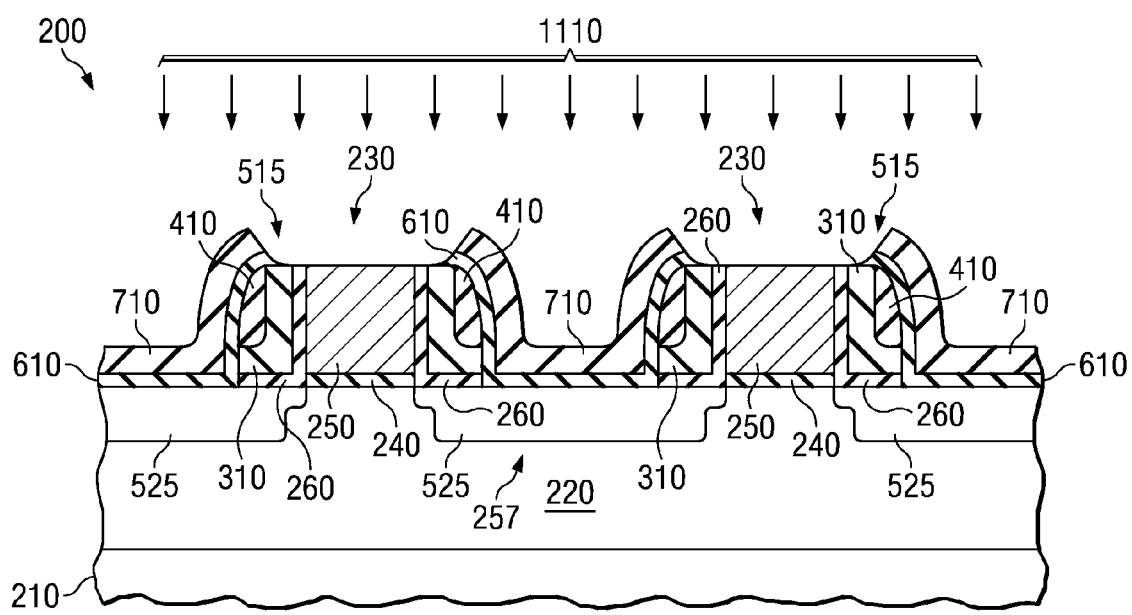
FIG. 11 illustrates a partial sectional view of the partially completed microelectronics device illustrated in FIG. 10 following an etch process that removes the remaining portion of the dielectric layer and a portion of the capping layer located over the gate electrodes to expose the capping layer with a portion remaining over the source/drains and moat region.

Referring now to FIG. 11, there is illustrated a partial, sectional view of the microelectronics device 200 of FIG. 10 following the removal of a portion of the capping layer 610. In an advantageous embodiment, an etch 1110 is conducted to remove a portion of the capping layer 610 that overlies the gate electrodes 250 and at the same time, remove the remaining portions 810a (FIG. 10) of the dielectric layer 810 located over the moat region 257 and the source/drains 525. The etch chemistry will vary depending on the type of material from which the capping layer 610 and the dielectric layer 810 are comprised. For example, in those embodiments where the capping layer 610 and the dielectric layer 810 are comprised of silicon dioxide, the etch 1110 may be a conventional hydrofluoric etch. It should be understood that the foregoing is exemplary only and that other removal techniques, such as reactive ion etching may also be employed in removing the portion of the capping layer 610 and the dielectric layer 810. In this aspect, the chosen removal process will be selective to the protective layer 710 and the gate electrodes 250; that is the selected etch 1110 or other removal technique should remove the capping layer 610 and the dielectric layer 810 at a much higher rate than either of the protective layer 710 or the gate electrodes 250. Moreover, the etch 1110 is preferably selective to the gate electrodes 250, and will, therefore, have little affect on them. Since the etch 1110 is selective to the surrounding materials, only small amounts of the protective layer 710 or the gate electrodes 250 will be removed at this point in the process. As seen from the exemplary embodiment illustrated in FIG. 11, the etch 1110 removes the cap layer 610 to expose the upper surface of the gate electrodes 250, but the protective layer 710 and the capping layer 610 located over the source/drains 525 and the moat region 257 remain in place.

Figure 12:
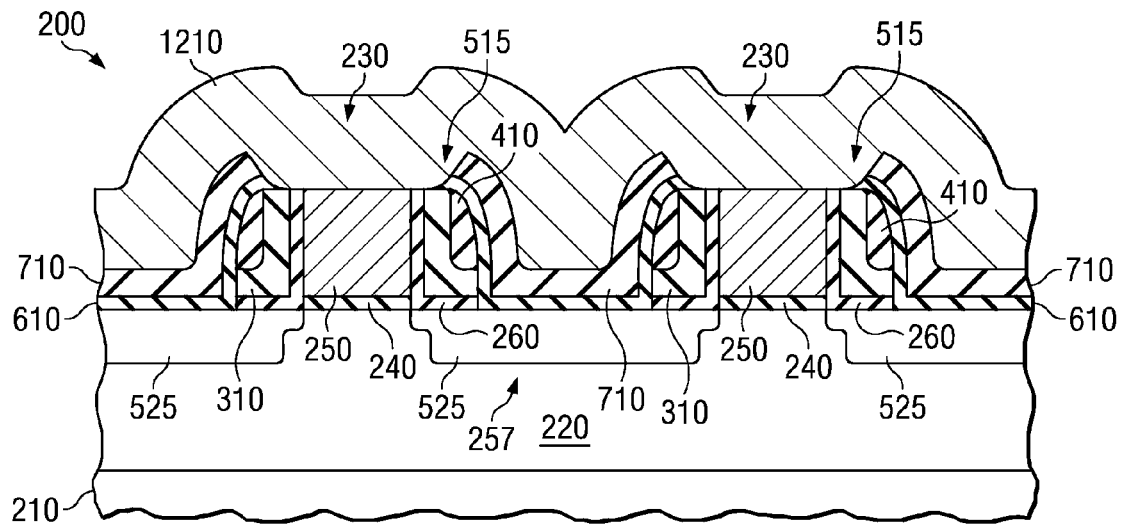
FIG. 12 illustrates a partial sectional view of the partially completed microelectronics device illustrated in FIG. 11 following the deposition of a metal layer over the gate electrodes, source/drains and moat region.

Turning to FIG. 12, there is illustrated a partial, sectional view of the microelectronics device 200 of FIG. 11 following the deposition of a metal layer 1210. Conventional deposition processes may be used to locate the metal layer 1210 over the exposed surfaces of the gate electrodes 250, source/drains 525 and the moat region 257. The thickness of the metal layer 1210 may vary and will depend, in some embodiments, on the thickness of the gate electrodes 250. For example, in one embodiment where the thicknesses of the gate electrodes 250 are about 80 nm thick, the thickness of the metal layer 1210 will be about 60 nm. Preferably, the metal layer 1210 is thick enough such that full silicidation of the gate electrodes 250 occurs. However, in other embodiments, full silicidation may not be necessary. In such cases, the metal layer 1210 may be thinner. The silicidation can be conducted until the desired work function of the respective gate electrodes 250 is achieved or the gate electrodes 250 are fully silicided. As shown, the metal layer 1210 covers the moat region 257 as well as the exposed surfaces of the gate electrodes 250, but the moat region 257 and source/drains 525 are protected from the metal layer 1210 by the presence of the cap layer 610 and the protective layer 710.

The metal layer 1210 may be nickel or cobalt or a combination thereof. In those embodiments where the metal layer 1210 is nickel, an exemplary silicide process comprises placing a blanket of nickel layer over the gate electrodes 250. As it takes approximately 1 nm of nickel to fully silicidize approximately 1.8 nm of polysilicon, the thickness of the blanket layer of nickel should be at least 56% of the thickness of the gate electrode 250. To be comfortable, however, it is suggested that the thickness of the layer of nickel should be at least 60% of the thickness of the gate electrode 250. Thus, where the thickness of the gate electrode 250 ranges from about 50 nm to about 150 nm, as described above, the thickness of the blanket layer of nickel should range from approximately 30 nm to about 90 nm. It should also be noted that the blanket layer of metal layer 1210 may comprise a number of different metals or combinations of metals, such as nickel and cobalt, while staying within the scope of the present invention. The nickel layer and the gate electrodes 250 are subjected to a thermal anneal having a temperature ranging from about 400 degrees centigrade to about 600 degrees centigrade and for a period of time ranging from about 10 seconds to about 100 seconds. It should be noted, however, that the silicidation process may vary depending on the amount of silicidation that is desired and the materials that are used to silicide the gate electrodes 250. For example, if the gate electrodes 250 are silicided with a combination of cobalt and nickel, then the silicidation process parameters and percentages of materials used will be different than those just stated above. Those who are skilled in the art will understand how to achieve the desired degree of silicidation when using such metal combinations.

After siliciding the gate electrode 250, any remaining or unreacted metal materials can be removed using conventional processes. It should be noted that the silicide does not form on the moat region 257 or the source/drains 525 at this time because the protective layer 710 and the capping layer 610, which are located over the moat region 257 and the source/drains 525 block the silicidation process from affecting those regions.

Figure 13:
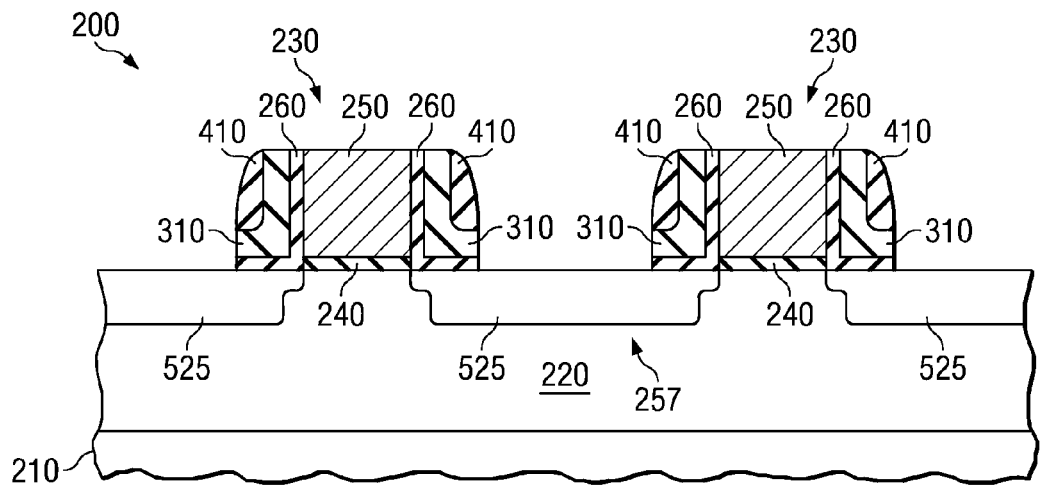
FIG. 13 illustrates a partial sectional view of the partially completed microelectronics device illustrated in FIG. 12 following the silicidation of the gate electrodes.

FIG. 13 shows the microelectronics device 200 of FIG. 12 following the silicidation process and removal of the excess metal layer 1210 and further illustrating the silicided gate electrodes 250 and the non-silicidation of the moat region 257 and the source/drain 525. The remaining portions of the protective layer 710 may be removed with an etch, similar to those described above. For example, if the protective layer 710 is a nitride layer, then the above-described dry nitride etch can be used. In addition, the remaining portions of the capping layer 610 are also removed, preferably with a hydrofluoric acid etch.

Figure 14:
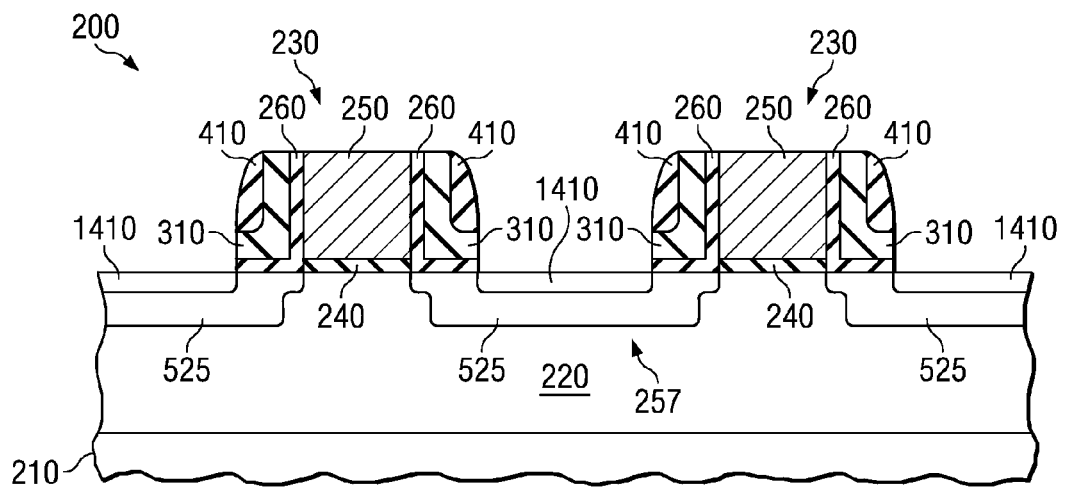
FIG. 14 illustrates a partial sectional view of the partially completed microelectronics device illustrated in FIG. 14 following the formation of contact pads over the source/drains and moat region.

FIG. 14 illustrates a partial sectional view of the partially completed microelectronics device 200 illustrated in FIG. 13 following the conventional formation of contact pads 1410 over the source/drains 525 and moat region 257, after which a pre-metal dielectric layer is conventionally deposited and contacts are conventionally formed in the pre-metal dielectric layer to arrive at the structure illustrated in FIG. 1.

Figure 15:
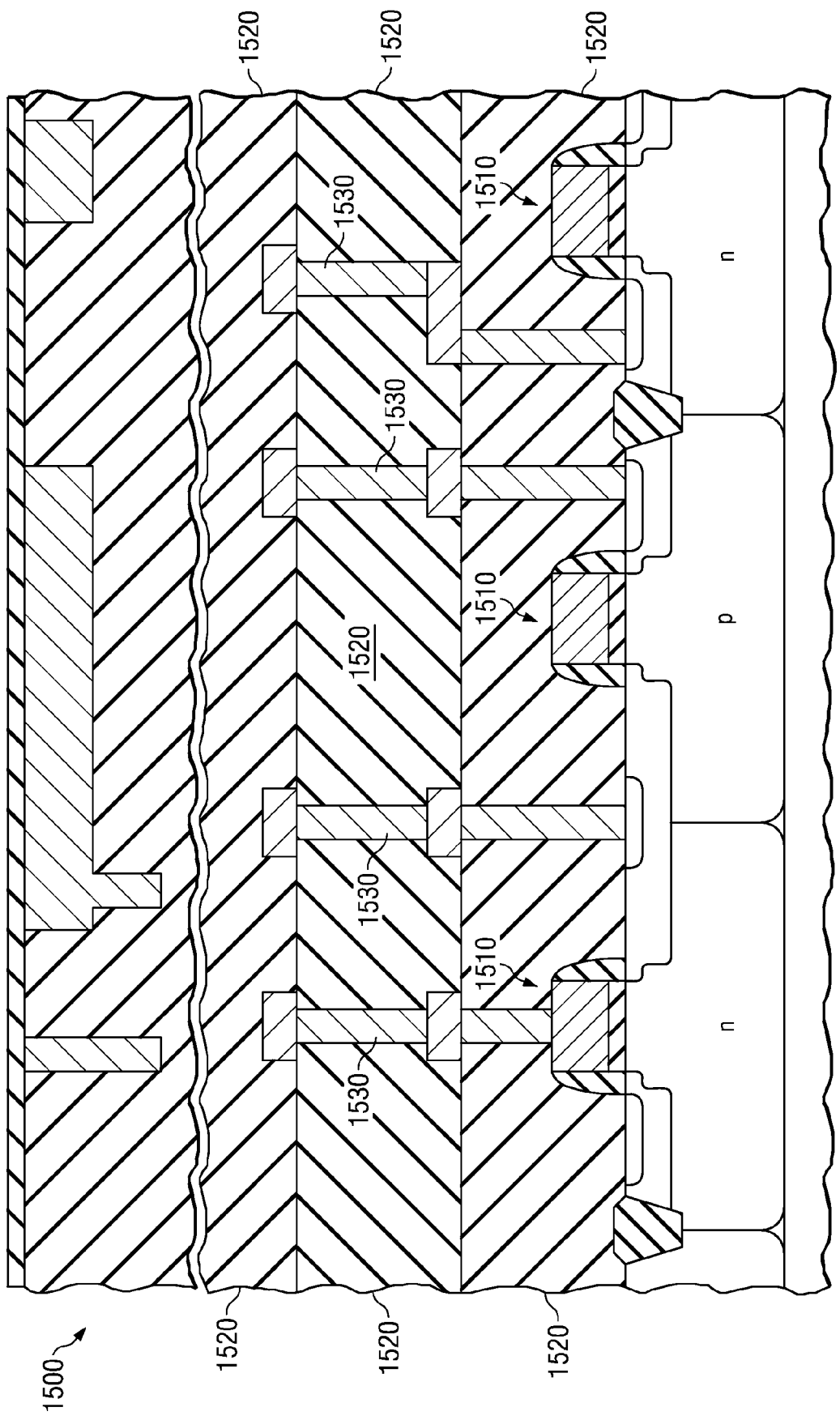
FIG. 15 illustrates an exemplary cross-sectional view of an integrated circuit (IC) incorporating devices constructed according to the principles of the present invention.

Referring finally to FIG. 15, illustrated is an exemplary cross-sectional view of an integrated circuit (IC) 1500 incorporating devices 1510 constructed according to the principles of the present invention. The devices 1510 may include a wide variety of devices, such as transistors used to form CMOS devices, BiCMOS devices, Bipolar devices, as well as capacitors or other types of devices. The IC 1500 may further include passive devices, such as inductors or resistors, or it may also include optical devices or optoelectronic devices. Those skilled in the art are familiar with these various types of devices and their manufacture. In the particular embodiment illustrated in FIG. 15, the devices 1510 are transistors over which dielectric layers 1520 are located, and the transistors include the various components as discussed above. Additionally, interconnect structures 1530 are located within the dielectric layers 1520 to interconnect various devices 1510, thus, forming an operational integrated circuit 1500.

Although the present invention has been described in detail, one who is of ordinary skill in the art should understand that they can make various changes, substitutions, and alterations herein without departing from the scope of the invention.

What is claimed is:

1. A method of fabricating a microelectronics device, comprising:
   forming a capping layer comprising oxide over gate structures located over a microelectronics substrate, the gate structures including sidewall spacers and having a doped region located therebetween;
   placing a protective layer comprising nitrogen over the capping layer and the doped region;
   removing a portion of the protective layer and capping layer located over the gate structures to expose a top surface of the gate structures, a remaining portion of the protective layer and capping layer remaining over the doped region, wherein removing the protective layer comprises removing the protective layer with a first etch to expose the capping layer and removing the capping layer comprises removing the capping layer with a second etch; and
   performing a silicide process to form silicided gate electrodes, wherein the remaining portion of the protective layer and the capping layer over the doped region blocks formation of a silicide in the doped region.

2. The method as recited in claim 1, further comprising depositing a dielectric layer over the protective layer, including the doped region prior to removing a portion of the protective layer and the capping layer.

3. The method as recited in claim 2, further comprising removing a portion of the dielectric layer to expose the protective layer located over the gate structures, a remaining portion of the dielectric layer remaining over the doped region.

4. The method as recited in claim 3, wherein removing the capping layer further comprises removing the remaining portion of the dielectric layer to expose the protective layer located over the doped region.

5. The method as recited in claim 1 further comprising removing the remaining portions of the protective layer and capping layer located over the doped region.

6. The method as recited in claim 1 wherein removing comprises using a nitride etch to remove the portion of the protective layer and using a hydrofluoric etch to remove the portion of the capping layer.

7. The method as recited in claim 6 wherein the nitride etch is a dry nitride etch or a wet phosphoric acid etch.

8. A method of fabricating an integrated circuit, comprising:
   forming transistors that comprise silicided gate electrodes over a microelectronics substrate, comprising;
      forming a capping layer comprising oxide over gate structures located over a microelectronics substrate, the gate structures including sidewall spacers and having a doped region located therebetween;
      placing a protective layer comprising nitrogen over the capping layer and the doped region;
      removing a portion of the protective layer and capping layer located over the gate structures to expose a top surface of the gate structures, a remaining portion of the protective layer and capping layer remaining over the doped region, wherein removing the protective layer comprises removing the protective layer with a first etch to expose the capping layer and removing the capping layer comprises removing the capping layer with a second etch; and
      performing a silicide process to form silicided gate electrodes, wherein the remaining portion of the protective layer and the capping layer over the doped region blocks formation of a silicide in the doped region; and
   forming dielectric layers over the silicided gate electrodes; and
   forming interconnects in the dielectric layers to electrically connect the transistors to form an operative integrated circuit.

9. The method as recited in claim 8, further comprising depositing a dielectric layer over the protective layer, including the doped region prior to removing a portion of the protective layer and the capping layer.

10. The method as recited in claim 9, further comprising removing a portion of the dielectric layer to expose the protective layer located over the gate structures, a remaining portion of the dielectric layer remaining over the doped region.

11. The method as recited in claim 10, wherein removing the capping layer further comprises removing the remaining portion of the dielectric layer to expose the protective layer located over the doped region.

12. The method as recited in claim 8 further comprising removing the remaining portions of the protective layer and capping layer located over the doped region.

13. The method as recited in claim 8 wherein removing comprises using a nitride etch to remove the portion of the protective layer and using a hydrofluoric etch to remove the portion of the capping layer.

14. The method as recited in claim 13 wherein the nitride etch is a dry nitride etch or a wet phosphoric acid etch.

15. A method of fabricating a semiconductor device, comprising:
   forming a capping layer over the semiconductor device, the semiconductor device including a gate structure and moat regions position adjacent to the gate structure;
   placing a protective layer over the capping layer;
   depositing a dielectric layer over the protective layer;
   removing a portion of the dielectric layer to expose the protective layer located over the gate structure, a remaining portion of the dielectric layer remaining over the moat regions;
   removing a portion of the protective layer and capping layer located over the gate structure to expose a top surface of the gate structure, a remaining portion of the protective layer and capping layer remaining over the moat regions; and
   performing a silicide process to form a silicided gate electrode.

16. The method as recited in claim 15, wherein removing the capping layer further comprises removing the remaining portion of the dielectric layer to expose the protective layer located over the moat regions.

* * * * *